United States Patent
He et al.

(10) Patent No.: US 10,147,803 B2
(45) Date of Patent: Dec. 4, 2018

(54) WORK FUNCTION METAL FILL FOR REPLACEMENT GATE FIN FIELD EFFECT TRANSISTOR PROCESS

(71) Applicant: INTERNATIONAL BUSINESS MACHINES CORPORATION, Armonk, NY (US)

(72) Inventors: Hong He, Schenectady, NY (US); Junli Wang, Singerlands, NY (US); Yongan Xu, Schenectady, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/214,851

(22) Filed: Jul. 20, 2016

(65) Prior Publication Data

US 2016/0329415 A1 Nov. 10, 2016

Related U.S. Application Data

(62) Division of application No. 14/184,229, filed on Feb. 19, 2014, now Pat. No. 9,406,746.

(51) Int. Cl.

| | |
|---|---|
| *H01L 29/66* | (2006.01) |
| *H01L 29/423* | (2006.01) |
| *H01L 29/78* | (2006.01) |
| *H01L 21/762* | (2006.01) |
| *H01L 29/06* | (2006.01) |
| *H01L 21/02* | (2006.01) |
| *H01L 21/311* | (2006.01) |

(Continued)

(52) U.S. Cl.
CPC .. *H01L 29/66795* (2013.01); *H01L 21/02115* (2013.01); *H01L 21/02274* (2013.01);
(Continued)

(58) Field of Classification Search
CPC ..... H01L 21/823431; H01L 21/823821; H01L 21/425; H01L 27/0886; H01L 27/0924;
(Continued)

(56) References Cited

U.S. PATENT DOCUMENTS

| | | | |
|---|---|---|---|
| 6,605,514 B1 | 8/2003 | Tabery et al. | |
| 6,645,797 B1 | 11/2003 | Buynoski et al. | |

(Continued)

OTHER PUBLICATIONS

Krishnan, M., et al. "Chemical Mechanical Planarization: Slurry Chemistry, Material, and Mechanics". Chemical Reviews, Nov. 2010. vol. 110. No. 1. p. 178-204.

(Continued)

*Primary Examiner* — Thanhha Pham
(74) *Attorney, Agent, or Firm* — Tutunjian & Bitetto, P.C.; Vazken Alexanian

(57) ABSTRACT

A method of forming a semiconductor device that includes forming a sacrificial gate structure on a channel portion of a fin structure, wherein the angle at the intersection of the sidewall of the sacrificial gate structure and an upper surface of the channel portion of the fin structure is obtuse. Epitaxial source and drain region structures are formed on a source region portion and a drain region portion of the fin structure. At least one dielectric material is formed on the sidewall of the sacrificial gate structure. The sacrificial gate structure may be removed to provide an opening to the channel portion of the fin structure. A function gate structure is formed in the opening. At least one angle defined by the intersection of a sidewall of the functional gate structure and an upper surface of the channel portion of the fin structure is obtuse.

16 Claims, 7 Drawing Sheets

(51) Int. Cl.
*H01L 21/28* (2006.01)
*H01L 29/08* (2006.01)
*H01L 29/49* (2006.01)
*H01L 29/40* (2006.01)

(52) U.S. Cl.
CPC .. *H01L 21/28088* (2013.01); *H01L 21/31122* (2013.01); *H01L 21/76224* (2013.01); *H01L 29/0649* (2013.01); *H01L 29/0653* (2013.01); *H01L 29/0847* (2013.01); *H01L 29/401* (2013.01); *H01L 29/42376* (2013.01); *H01L 29/4966* (2013.01); *H01L 29/66545* (2013.01); *H01L 29/785* (2013.01)

(58) Field of Classification Search
CPC ......... H01L 27/10826; H01L 29/66795; H01L 29/42376; H01L 29/42372; H01L 29/66545; H01L 29/785
See application file for complete search history.

(56) References Cited

U.S. PATENT DOCUMENTS

| | | |
|---|---|---|
| 6,664,154 B1 | 12/2003 | Bell et al. |
| 7,015,124 B1 | 3/2006 | Fisher et al. |
| 9,406,746 B2 | 8/2016 | He |
| 2005/0148137 A1* | 7/2005 | Brask ................ H01L 21/82382 438/216 |
| 2012/0083121 A1 | 4/2012 | Ando et al. |
| 2012/0313170 A1 | 12/2012 | Chang et al. |
| 2013/0005097 A1 | 1/2013 | Xu et al. |
| 2013/0017680 A1 | 1/2013 | Haran et al. |
| 2013/0134513 A1 | 5/2013 | Standaert et al. |
| 2014/0042553 A1 | 2/2014 | Chiang et al. |
| 2015/0024561 A1 | 1/2015 | Li et al. |
| 2015/0171216 A1* | 6/2015 | Xie ..................... H01L 21/0217 257/401 |
| 2015/0318354 A1 | 11/2015 | Yin et al. |

OTHER PUBLICATIONS

Yoshida, N., et al. "Replacement Metal Gate Extendible to 11 nm Technology". IEEE Symposium on VSL Technology (VLSIT), Jun. 2012. p. 81-82.

Office Action dated Apr. 14, 2017, which was cited in corresponding U.S. Appl. No. 15/182,995.

U.S. Office Action issued in U.S. Appl. No. 15/182,995, dated Nov. 20, 2017, pp. 1-14.

U.S. Office Action issued in U.S. Appl. No. 15/182,995, dated Apr. 5, 2018, pp. 1-15.

* cited by examiner

WORK FUNCTION METAL FILL FOR REPLACEMENT GATE FIN FIELD EFFECT TRANSISTOR PROCESS

BACKGROUND

Technical Field

The present disclosure relates to semiconductor devices, such as semiconductor devices including fin structures. The present disclosure further relates to replacement gate processing of FinFET devices.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method is disclosed for forming semiconductor devices including fin structures. In one embodiment, the method includes forming a sacrificial gate structure on a channel portion of a fin structure. The sidewall of the sacrificial gate structure intersects with the upper surface of the channel portion of the fin structure at an angle that is obtuse. Thereafter, at least one dielectric material may be formed on at least a sidewall of the sacrificial gate structure. The sacrificial gate structure may be removed to provide an opening to the channel portion of the fin structure. A functional gate structure is formed in the opening to the channel portion of the fin structure. At least one angle defined by an intersection of a sidewall of the functional gate structure and the upper surface of the channel portion of the fin structure is obtuse.

In another embodiment, the method includes forming a sacrificial gate structure on a channel portion of a fin structure. At least one obtuse angle is defined by the intersection of a sidewall of the sacrificial gate structure and an upper surface of the channel portion of the fin structure. Epitaxial source and drain region structures may then be formed on a source region portion and a drain region portion of the fin structure. Thereafter, at least one dielectric material may be formed on at least a sidewall of the sacrificial gate structure, and the epitaxial source region and drain region structures. The sacrificial gate structure may be removed to provide an opening to the channel portion of the fin structure. A functional gate structure is formed in the opening to the channel portion of the fin structure, wherein at least one angle defined by the intersection of a sidewall of the functional gate structure and an upper surface of the channel portion of the fin structure is obtuse.

In another aspect, a semiconductor device is provided that includes a fin structure and a gate structure present on a channel portion of the fin structure. The gate structure has a sidewall that intersects with the upper surface of the channel portion of the fin structure. An obtuse angle is defined between the sidewall of the gate structure and the upper surface of the channel portion of the fin structure. An epitaxial source region structure is present on a source region portion of the fin structure, and an epitaxial drain region structure is present on a drain region portion of the fin structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1A:
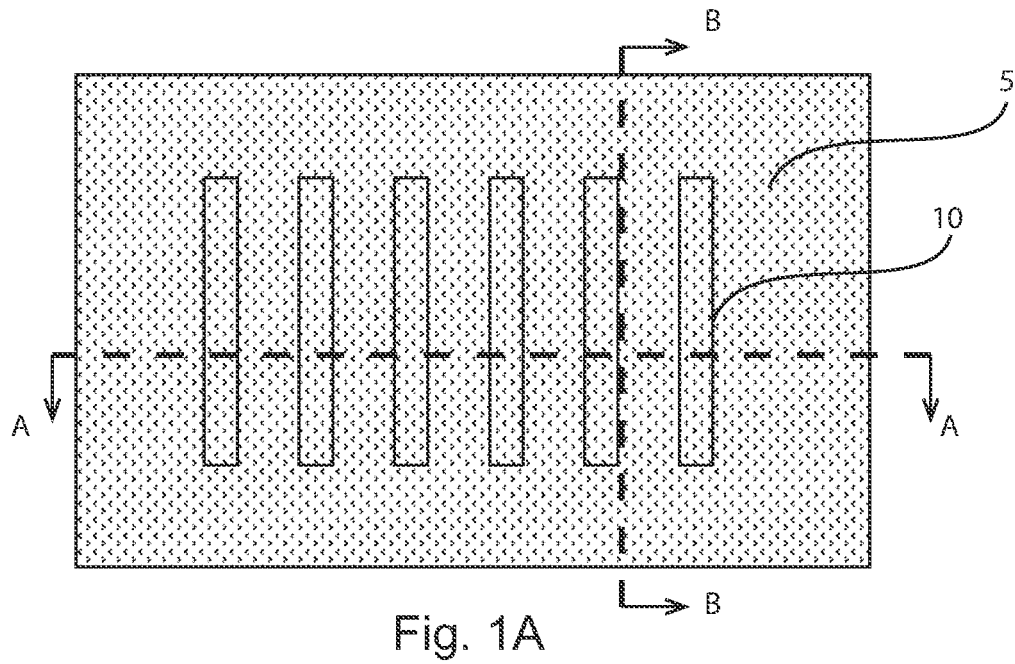
FIG. 1A is a top down planar view depicting forming fin structures from a bulk semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein are related to replacement gate technology. Typically, in replacement gate technology, a dummy gate structure, which is hereafter referred to as a sacrificial gate structure, is patterned first, followed by gate sidewall spacer formation. Thereafter, epitaxial source region and drain region structures may be formed. An interlevel dielectric layer can then be deposited and planarized until an upper surface of the sacrificial gate structure is exposed. The sacrificial gate structure may then be removed using an etch process. Thereafter, a functional gate structure is formed. Typically, the sacrificial gate profile is insufficient for the replacement gate process flow, wherein after being removed, the opening left by removing the sacrificial gate structure is insufficient for filling with metals in the formation of the functional gate structure.

More specifically, it has been determined that the profile of the sacrificial gate structure has a sidewall that forms an acute angle, i.e., less than 90 degrees, at the point of intersection with the upper surface of the channel portion of the fin structure. Following formation of the above described interlevel dielectric layer, when the sacrificial gate structure is removed, the opening to the channel portion of the fin structure has a narrower upper dimension than the base of the opening. The narrow upper dimension obstructs the deposition of the material for the gate dielectric and the gate conductor of the functional gate structure that is to be formed in the opening to the channel portion of the fin structure. This is especially the case for tight pitch FinFET arrangements, in which the typical replacement gate process is not scalable. For example, as the sacrificial gate height becomes taller in order to compensate for process variations in the gate hard mask and work function recess uniformity, and with smaller gate lengths at tighter gate pitches, the sacrificial gate structure is positioned a higher aspect ratio, which results in a greater risk of pattern collapse. Additionally, in a typical replacement gate process flow, the dielectric material that provides isolation between adjacent fin structures will be partially eroded during the sacrificial gate structure and gate sidewall spacer patterning steps, which can lead to disadvantageous fin erosion.

In some embodiments, the methods and structures disclosure herein can overcome the above referenced deficiencies using a damascene dummy gate process (also referred to as damascene replacement gate process), in which the dummy gate structure (hereafter referred to as sacrificial gate structure) has a sidewall positioned to provide an obtuse angle at the interface with the upper surface of the channel portion of the fin structure. In some embodiments, the material of the sacrificial gate structure is selected to provide that the sacrificial gate structure may be etched selectively to the isolation oxide material that is present around the fin structures. The methods and structures of the present disclosure are now discussed with more detail referring to FIGS. 1-10.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure.

Figure 1B:
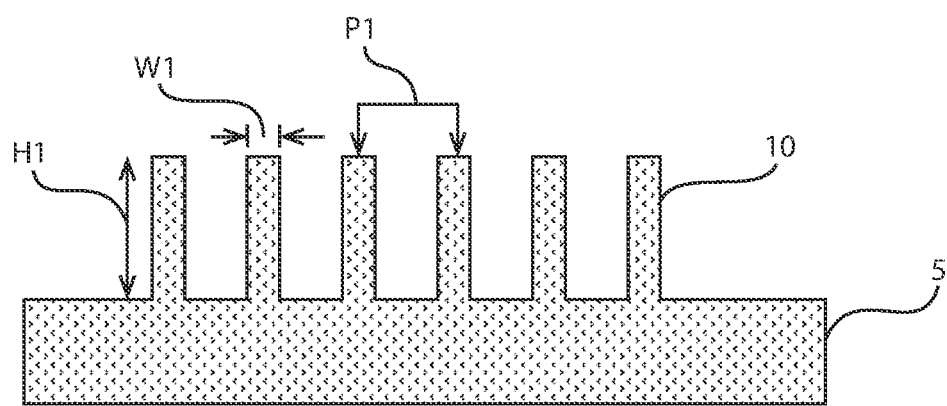
FIG. 1B is a side cross-sectional view of the structure depicted in FIG. 1A along section line A-A, which is hereafter referred to as a cross-section perpendicular to the length of the fin structures. A side cross-sectional view along section line B-B depicted in FIG. 1B is hereafter referred to as a cross-section parallel to the length of the fin structures.

FIGS. 1A and 1B depict one embodiment of forming a plurality of fin structures 10 from a bulk semiconductor substrate 5. A "bulk semiconductor substrate" is a substrate that is composed of a single semiconductor material. A bulk semiconductor substrate 5 does not include a buried dielectric layer that is typically present in silicon on insulator (SOI) substrates. The semiconductor material that provides the bulk semiconductor substrate 5 may be a semiconducting material including, but not limited to, silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other II/V and II/VI compound semiconductors.

The plurality of fin structures 10 may be formed from the bulk semiconductor substrate 5, using photolithography and etch processes. In one example, a photoresist mask is formed overlying the bulk semiconductor substrate 5, in which the portion of the bulk semiconductor substrate 5 that is underlying the photoresist mask provides the plurality of fin structures 10. The portion of the bulk semiconductor substrate 5 that is not protected by the photoresist mask is removed using a selective etch process. To provide the photoresist mask, a photoresist layer is first positioned on the bulk semiconductor substrate 5. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the bulk semiconductor substrate 5 selectively to the photoresist mask. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may be timed to determine the height of the fin structures 10.

Each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 50 nm. Each of the plurality of fin structures 10 may have a width $W_1$ of less than 20 nm. In another embodiment, each of the fin structures 10 has a width $W_1$ ranging from 3 nm to 8 nm. Although six fin structures 10 are depicted in FIGS. 1A and 1B, the present disclosure is not limited to only this example. It is noted that any number of fin structures 10 may be formed from the bulk semiconductor substrate 5. The pitch P1 separating adjacent fin structures in the plurality of fin structures 10 may range from 15 nm to 200 nm. In another example, the pitch P1 separating adjacent fin structures 10 may range from 15 nm to 100 nm.

It is noted that the present disclosure is not limited to only bulk semiconductor substrates. In some embodiments, a semiconductor on insulator substrate may be substituted for the bulk semiconductor substrate 5.

Figure 2:
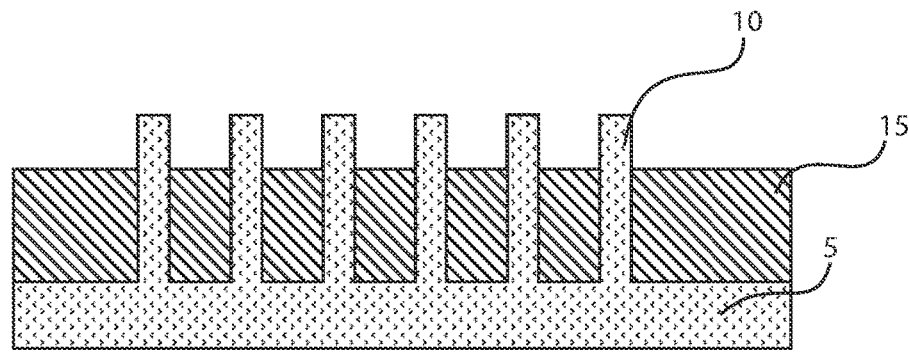
FIG. 2 is a side cross-sectional view perpendicular to the length of the fin structures depicting forming isolation regions adjacent to the fin structures, in accordance with one embodiment of the present disclosure.

FIG. 2 depicts one embodiment of forming isolation regions 15 adjacent to the fin structures 10. In some embodiments, the isolation regions 15 may be composed of a dielectric material, such as an oxide, nitride or oxynitride dielectric. For example, in some embodiments, when the isolation regions 15 are composed of an oxide, the oxide may be silicon oxide ($SiO_2$), and when the isolation regions 15 are composed of a nitride, the nitride may be silicon nitride ($Si_3N_4$). Other examples of materials that may be employed for the isolation regions 15 include silicon oxynitride, hafnium oxide, hafnium oxynitride, alumina and combinations thereof. The isolation regions 15 may also be formed using chemical vapor deposition (CVD), PECVD, high-density plasma CVD (HPCVD), chemical solution deposition or a spin-on glass process. In some embodiments, following deposition, the material of the isolation regions 15 may be recessed by an etch process, such as an anisotropic or isotropic etch process. For example, the isolation regions 15 may be recessed using reactive ion etch. The isolation regions 15 may be recessed to have a height that is less than half the height $H_1$ of the fin structures 10. In some embodiments, the isolation regions 15 may be recessed to have a height that is less than a quarter of the height H1 of the fin structures 10.

It is noted that the isolation regions 15 are depicted with a broken line to illustrate their presence in the cross-section parallel to the length of the fin structures 10. The cross section depicted in FIG. 2 is taken along a sidewall of the fin structures 10. The isolation regions 15 are in contact with the sidewall of the fin structures 10, but typically would not be visible at an exact cross section on the sidewall of the fin structure. For the purposes of clarity, isolation regions 15 have been depicted in FIG. 2 using a broken line to illustrate their presence adjacent to the cross section taken at the sidewall of the fin structure 10.

Figure 3:
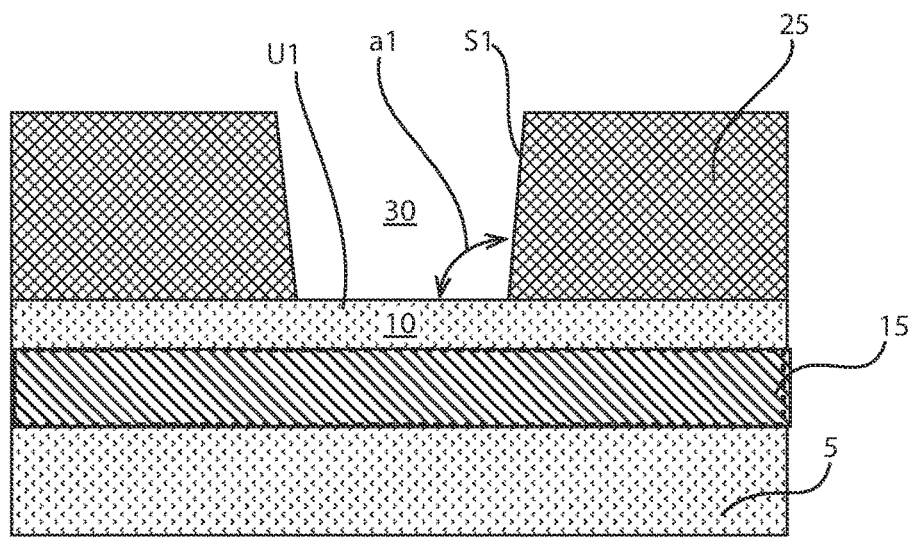
FIG. 3 is a side cross-sectional view parallel to the length of the fin structures depicting forming a sacrificial dielectric layer over the fin structure, and forming an opening through the sacrificial dielectric layer to expose a channel portion of the fin structure, in accordance with one embodiment of the present disclosure.

FIG. 3 depicts one embodiment of forming a sacrificial dielectric layer 25 over the fin structures 10, and forming an opening 30 through the sacrificial dielectric layer 25 to expose a channel region portion of the fin structure 10. The material of the sacrificial dielectric layer 25 is selected to be removed selectively to the isolation regions 15 that are present adjacent to the exterior surfaces of the fin structure 10. In one embodiment, the sacrificial dielectric layer 25 may be composed of boron doped carbon (B—C), which may also be referred to as boron doped diamond (BDD), or amorphous carbon (aC).

Boron doped carbon (B—C) is formed by substituting hybridized carbon atoms in a diamond lattice with boron atoms. In some embodiments, a boron doped carbon film is formed using chemical vapor deposition (CVD). Some examples of CVD methods that are suitable for forming boron doped carbon (B—C) include hot filament CVD, direct current (DC) plasma CVD, radio frequency (RF) plasma CVD, microwave plasma CVD, electron cyclotron resonance (ECR) microwave plasma CVD, and combinations thereof. Boron may be introduced to the boron doped carbon film by in situ doping (during diamond thin film synthesis) and by ex situ (after diamond thin film synthesis, e.g., ion implantation) doping routes.

The amorphous carbon layer may include carbon and hydrogen, or carbon, hydrogen, and a dopant, such as nitrogen, boron, fluorine, phosphorus, or mixtures thereof, among others. Amorphous carbon may be deposited by a variety of methods, such as CVD, plasma enhanced chemical vapor deposition (PECVD), high density plasma chemical vapor deposition (HDPCVD), or combinations thereof. In one embodiment, the amorphous carbon layer is formed from a gas mixture of a hydrocarbon compound and an inert gas such as argon, helium, xenon, krypton, neon, or combinations thereof. In some embodiments, the carbon source is a gaseous hydrocarbon, such as a linear hydrocarbon. In one embodiment, the hydrocarbon compound has a general formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used as the hydrocarbon compound. In general, the following deposition process parameters can be used to form the amorphous carbon layer. The process parameters may range from a wafer temperature of 100° C. to 700° C., a chamber pressure of 1 torr to 20 torr, a hydrocarbon gas flow rate of 50 sccm to 500 sccm (per 8 inch wafer), a RF power of between 1 $W/in^2$ and 100 $W/in^2$, such as between 3 W/in$^2$ and 20 W/in$^2$, and a plate spacing of between 300 mils to 600 mils.

It is noted that the above compositions for the sacrificial dielectric layer 25 is provided for illustrative purposes only, and are not intended to limit the present disclosure. For example, the sacrificial dielectric layer 25 may have any composition that may be removed selectively to the material of the isolation region 15. In one example, the sacrificial dielectric layer 25 may be composed of polysilicon. The sacrificial dielectric layer 25 may also be formed using other methods besides chemical vapor deposition methods. For example, the sacrificial dielectric layer 25 may be formed using spin on deposition or solution deposition. In one embodiment, the thickness of the sacrificial dielectric layer 25 may range from 5 nm to 200 nm. In another embodiment, the thickness of the sacrificial dielectric layer 25 may range from 10 nm to 100 nm.

Still referring to FIG. 3, in some embodiments, an opening 30 may be formed through the sacrificial dielectric layer 25 to expose a channel portion of the fin structure 10. The geometry of the opening 30 dictates the geometry of the later formed sacrificial gate structure that is formed in the opening 30. In some embodiments, the opening 30 has a sidewall S1 that intersects with an upper surface U1 of the channel portion of the fin structure 10 to define an obtuse angle $\alpha 1$. The term "obtuse angle" as used herein denotes an angle that is greater than 90°. In some embodiments, the obtuse angle $\alpha 1$ defined by the intersection of the sidewall S1 of the opening 30 and the upper surface U1 of the channel portion of the fin structure 10 ranges from 91° to 125°. In another embodiment, the obtuse angle $\alpha 1$ defined by the intersection of the sidewall S1 of the opening 30 and the upper surface U1 of the channel portion of the fin structure 10 ranges from 91° to 105°. In yet another embodiment, the obtuse angle $\alpha 1$ ranges from 91° to 95° C.

The opening 30 may be formed using pattern and etch processing. For example, an etch mask may be formed on the upper surface of the sacrificial dielectric layer 25 leaving the portion of the sacrificial dielectric layer 25 exposed that is to be etched. The etch mask (not shown) may comprise soft and/or hardmask materials and can be formed using deposition, photolithography and etching. For example, an etch mask composed of photoresist may be formed by applying a photoresist to the surface to be etched, exposing the photoresist to a pattern of radiation, and then developing the pattern into the photoresist utilizing a resist developer. In some embodiments, a hard mask may also be used to define the area for etching to provide the opening 30. In one embodiment, the hard mask (not shown) is composed of a nitride-containing material, such as silicon nitride. Other hardmask compositions for the etch mask may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

Following the formation of the etch mask, the exposed portions of the sacrificial dielectric layer 25 are etched to provide the opening 17 to the channel portion of the fin structure 10. In some embodiments, the etch process removes the exposed amorphous carbon material or exposed boron doped carbon material of the sacrificial dielectric layer 25 selectively to the etch mask, the oxide material, i.e., $SiO_2$, of the isolation regions 15 and the semiconductor material, e.g., silicon (Si), of the fin structure 10. In some embodiments, the etch process is tailored to provide the obtuse angle $\alpha 1$ defined by the intersection of the sidewall S1 of the opening 30 and the upper surface U of the channel portion of the fin structure 10. For example, when the sacrificial dielectric layer 25 is composed of amorphous carbon, to provide the obtuse angle $\alpha 1$ the etch process may include oxygen plasma isotropic etching, which has a high selectivity for silicon oxide ($SiO_2$). For example, the oxygen plasma isotropic etching may have a selectivity for silicon oxide ($SiO_2$) on the order of 80:1. In the embodiments, in which the sacrificial dielectric layer 25 is composed of silicon nitride, e.g., $Si_3N_4$, a hot phosphorus solution can be used to etch silicon nitride selectively to silicon oxide.

In some embodiments, the etch process for removing the exposed portions of the sacrificial dielectric layer 25 is selective to the fin structures 10. The term "selective", as used to describe a material removal process, denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The etch process for removing the exposed portions of the sacrificial dielectric layer 25 may be an anisotropic etch or an isotropic etch. In some examples, the etch process may be a wet chemical etch, reactive ion etch (RIE), plasma etch, laser etch and combinations thereof.

Figure 4:
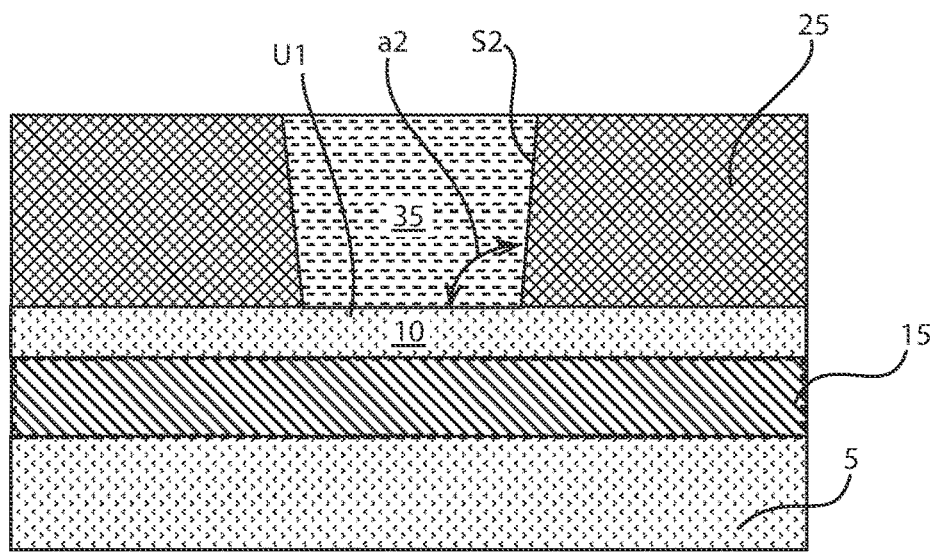
FIG. 4 is a side cross-sectional view parallel to the length of the fin structure depicting forming a sacrificial gate structure in the opening to the channel portion of the fin structure, in accordance with one embodiment of the present disclosure.

FIG. 4 depicts one embodiment of forming a sacrificial gate structure 35 in the opening 30 to the channel portion of the fin structure 10. As used herein, the term "sacrificial gate structure" denotes a structure that dictates the geometry and location of the later formed functioning gate structure. The "functional gate structure" functions to switch the semiconductor device from an "on" to "off" state, and vice versa. In one embodiment, the sacrificial material that provides the sacrificial gate structure 35 may be composed of a silicon-including material, such as polysilicon. The polysilicon of the sacrificial gate structure 35 may be deposited to fill the opening 30 to the channel portion of the fin structure 10 using a deposition process, such as chemical vapor deposition (CVD). Variations of CVD processes that are suitable for forming the sacrificial gate structure 35 include, but are not limited to, atmospheric pressure CVD (APCVD), low pressure CVD (LPCVD) and plasma enhanced CVD (PECVD), metal organic CVD (MOCVD) and combinations thereof. It is noted that the sacrificial gate structure 35 is not limited to only the polysilicon containing compositions. For example, the sacrificial gate structure 35 may be composed of any number of material layers and any number of material compositions, so long as the sacrificial gate structure 35 can be removed selectively to the fin structures 10. In some examples, the sacrificial gate structure 35 may be composed of a dielectric material, such as an oxide, nitride or oxynitride material, or amorphous carbon.

The geometry of the opening 30 dictates the geometry of the sacrificial gate structure that 35 that is formed within the opening 30. Therefore, the obtuse angle $\alpha 1$ that is defined by the intersection of the sidewall S1 of the opening 30 and the upper surface U1 of the channel portion of the fin structure 10 depicted in FIG. 3 is maintained as an obtuse angle $\alpha 2$ at the intersection of the sidewall S2 of the sacrificial gate structure 35 and the upper surface U1 of the channel portion of the fin structure 10, as depicted in FIG. 4. For example, the obtuse angle $\alpha 2$ defined by the intersection of the sidewall S2 of the sacrificial gate structure 35 and the upper surface U1 of the channel portion of the fin structure 10 may range from 91° to 125°. In another example, the obtuse angle $\alpha 2$ defined by the intersection of the sidewall S2 of the sacrificial gate structure 35 and the upper surface U1 of the channel portion of the fin structure 10 ranges from 91° to 105°. In yet another embodiment, the obtuse angle α2 ranges from 91° to 95° C.

Figure 5A:
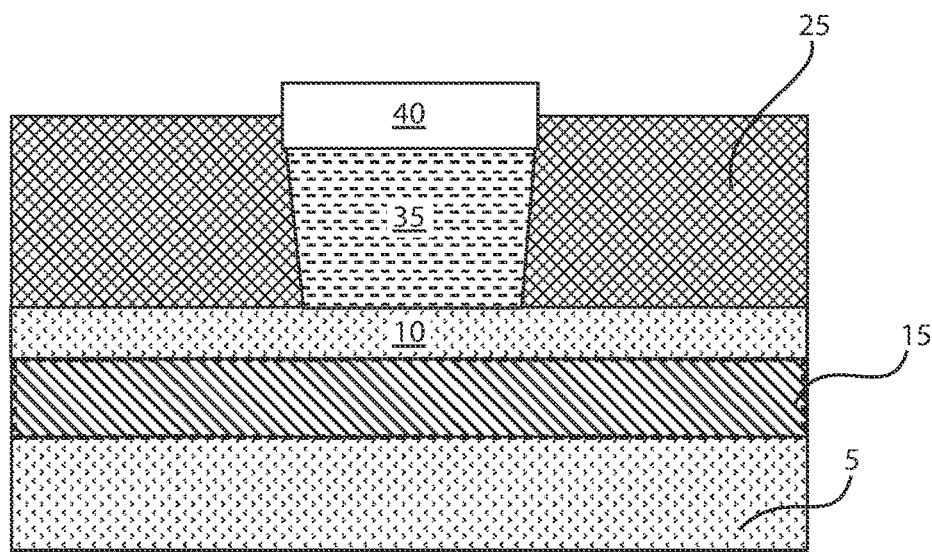
FIG. 5A is a side cross-sectional view parallel to the length of the fin structure depicting one embodiment of forming sacrificial gate cap on the a sacrificial gate structure that is depicted in FIG. 4.
Figure 5B:
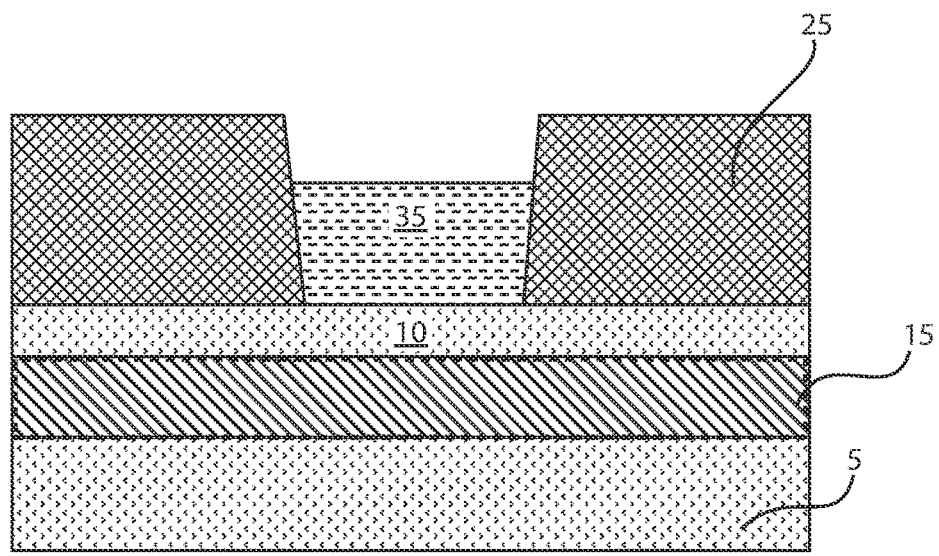
FIG. 5B is a side cross-sectional view parallel to the length of the fin structure depicting recessing the upper surface of the sacrificial gate structure depicted in FIG. 4.
Figure 5C:
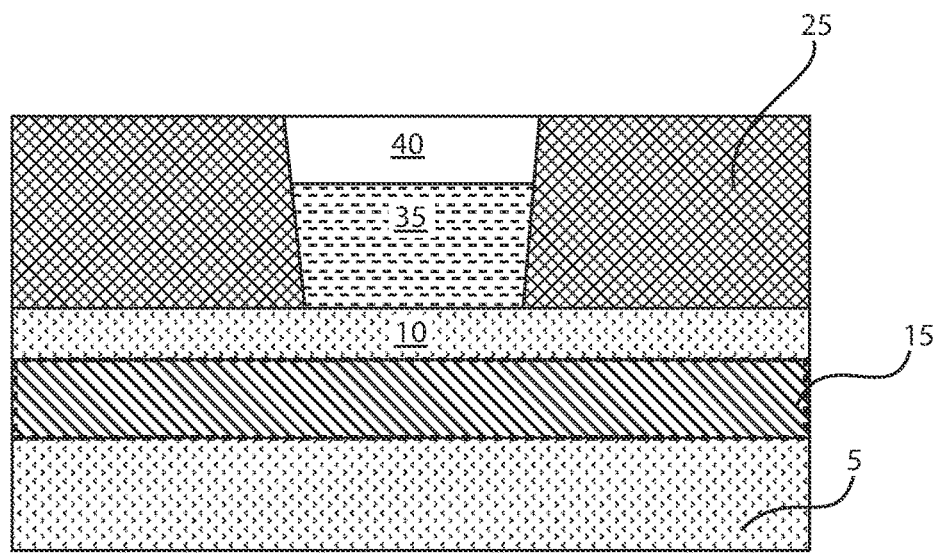
FIG. 5C is a side cross-sectional view parallel to the length of the fin structure depicting depositing a sacrificial gate cap on the recessed surface of the sacrificial gate structure depicted in FIG. 5B.

FIGS. 5A-5C depict some embodiments of forming a sacrificial gate cap 40 on the sacrificial gate structure 35. The sacrificial gate cap 40 is typically composed of a dielectric material such as an oxide, nitride or oxynitride material. In one example, when the sacrificial gate cap 40 is composed of an oxide, the sacrificial gate cap 40 may be composed of silicon oxide. In another example, when the sacrificial gate cap 40 is composed of a nitride, the sacrificial gate cap 40 is composed of silicon nitride. Referring to FIG. 5A, in one embodiment, a sacrificial gate cap 40 composed of silicon oxide ($SiO_2$) may be formed on the upper surface of the sacrificial gate structure 35 using thermal oxidation, in which the structure is heated in an oxygen containing atmosphere. In FIGS. 5B and 5C, the sacrificial gate cap 40 is deposited on a recessed upper surface of the sacrificial gate structure 35. FIG. 5B depicts one embodiment of recessing an upper surface of the sacrificial gate structure 35 using a selective etch process, such as reactive ion etch. FIG. 5C depicts depositing the material for the sacrificial gate cap 40 on the recessed upper surface of the sacrificial gate structure 35. In the embodiment depicted in FIG. 5C, the deposited material may be silicon oxide, silicon nitride, silicon oxynitride or any other deposited dielectric material. The material deposited for the sacrificial gate cap 40 that is depicted in FIG. 5C may be deposited using CVD, spin on deposition or solution deposition. In some embodiments, the upper surface of the sacrificial gate cap 40 may be planarized using chemical mechanical planarization.

Figure 6:
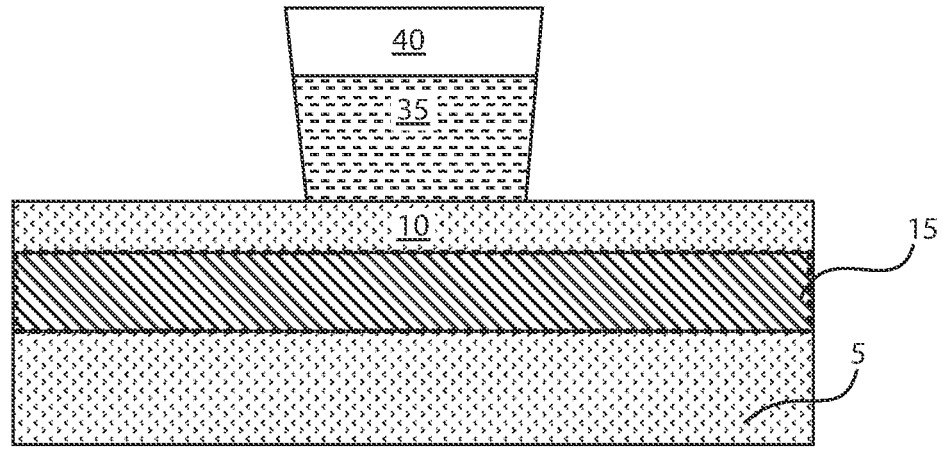
FIG. 6 is a side cross-sectional view parallel to the length of the fin structure depicting removing the sacrificial dielectric layer, in accordance with one embodiment of the present disclosure.

FIG. 6 depicts one embodiment of removing the sacrificial dielectric layer 25. The sacrificial dielectric layer 25 may be removed by an etch chemistry that is selective to the isolation region 15, the sacrificial gate cap 40, and the fin structures 10. The sacrificial dielectric layer 25 may be removed by reaction ion etching, plasma etching and/or wet chemical etching. In one embodiment, in which the sacrificial dielectric layer 25 is composed of amorphous silicon or boron doped with carbon, the fin structure 10 is composed of silicon (Si), and the isolation regions 15 are composed of silicon oxide ($SiO_2$), the etch chemistry for removing the sacrificial dielectric layer 25 may include oxygen plasma isotropic etching, which has a high selectivity for silicon oxide ($SiO_2$). For example, the oxygen plasma isotropic etching may have a selectivity for silicon oxide ($SiO_2$) on the order of 80:1. In the embodiments, in which the sacrificial dielectric layer 25 is composed of silicon nitride, e.g., $Si_3N_4$, a hot phosphorus solution can be used to etch silicon nitride selectively to silicon oxide.

FIG. 6 depicts removing the sacrificial dielectric layer 25 from the structure depicted in FIG. 5A that includes a sacrificial gate cap 40 that is formed using thermal oxidation. The process step of removing the sacrificial dielectric layer 25 is equally applicable to the embodiments of the present disclosure that form a sacrificial gate cap 40 with an etch to recess the sacrificial gate structure 35 and a deposition process for forming the material of the sacrificial gate cap 40 on the recessed surface of sacrificial gate structure 35 as described in FIGS. 5B and 5C.

Figure 7:
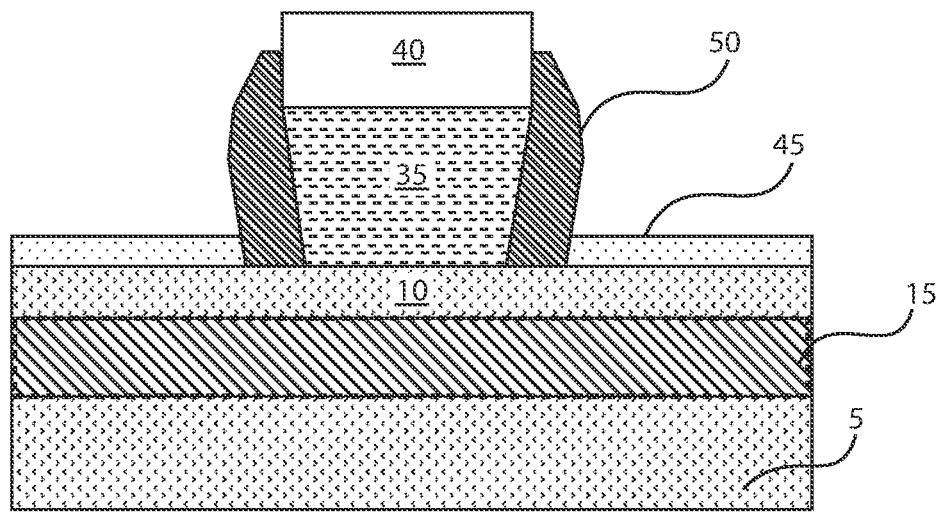
FIG. 7 is a side cross-sectional view parallel to the length of the fin structure depicting forming a gate sidewall spacer on the sidewall of the sacrificial gate structure, and forming epitaxial source and drain region structures on the source region portion and drain region portion of the fin structures, in accordance with one embodiment of the present disclosure.

FIG. 7 depicts one embodiment of forming gate sidewall spacer 50 on the sidewalls of the sacrificial gate structure 35. In one embodiment, the gate sidewall spacer 50 may be formed by using a blanket layer deposition, such as chemical vapor deposition, and an anisotropic etchback method. The gate sidewall spacer 50 may have a width ranging from 2.0 nm to 15.0 nm, and may be composed of a dielectric, such as a nitride, oxide, oxynitride, or a combination thereof.

FIG. 7 further depicts forming epitaxial source and drain region structures 45 on the source region portion and drain region portion of the fin structures 10. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. The "channel" is the region of the underlying the gate structure and between the source and drain of a semiconductor device that becomes conductive when the semiconductor device is turned on. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. To provide source and drain region structures, the epitaxial material is doped to an n-type or p-type conductivity. When the epitaxial source and drain region structures 45 are doped to an n-type conductivity, the FinFET device is an n-type FinFET device. When the epitaxial source and drain regions 45 are doped to a p-type conductivity, the FinFET device is a p-type FinFET device.

In some embodiments, the epitaxial source and drain region structures 45 is formed on the exposed sidewall of at least one of a source region portion and a drain region portion of the fin structures 10, and optionally along an upper surface of the source region portion and the drain region portions of the fin structures 10. In some embodiments, epitaxial deposition of the epitaxial semiconductor material 40 is a selective deposition process. For example, although the epitaxially deposited material orientates to the crystal arrangement of a semiconductor material and is deposited thereon, the epitaxial semiconductor material may not be deposited on a dielectric material, such as the gate sidewall spacer 50, the isolation region 15 and the sacrificial gate cap 40.

In some embodiments, the epitaxial material of the epitaxial source and drain region structures 45 may be composed of a silicon-containing material. For example, the epitaxial material of the epitaxial source and drain region structures 45 may be composed of a base material entirely of silicon, i.e., not counting dopants for charge carriers. In other embodiments, the epitaxial material of the epitaxial source and drain region structures 45 is composed of germanium, silicon germanium, a silicon germanium and carbon alloy (e.g., silicon germanium doped with carbon (SiGe: C), germanium alloys, gallium arsenic, indium arsenic, indium phosphide, as well as other II/V and I/VI compound semiconductors. Examples of silicon including source gasses for forming the epitaxial source and drain region structures 45 may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for forming epitaxial source and drain region structures 45 of a germanium containing semiconductor include germane, digermane, halogermane, dichlorogermane, trichlorogermane, tetrachlorogermane and combinations thereof.

Epitaxial deposition for forming the epitaxial source and drain region structures 45 may be carried out in a chemical vapor deposition apparatus, such as a metal organic chemical vapor deposition (MOCVD) apparatus or a plasma enhanced chemical vapor deposition (PECVD) apparatus.

In some embodiments, the epitaxial source and drain region structures 45 may be in-situ doped. By "doped" it is meant that the epitaxial material of the epitaxial source and drain region structures 45 includes a p-type or n-type dopant present therein. As used herein, "p-type" refers to the addition of impurities to an intrinsic semiconductor that creates deficiencies of valence electrons. In a type IV semiconductor, such as silicon, examples of p-type dopants, i.e., impurities include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

For example, the concentration of the p-type or n-type dopant in the epitaxial semiconductor material may range from $5 \times 10^{20}$ atoms/cm$^3$ to $8 \times 10^{20}$ atoms/cm$^3$. In another example, the concentration of the p-type or n-type dopant in the epitaxial semiconductor material may range from $6 \times 10^{20}$ atoms/cm$^3$ to $7 \times 10^{20}$ atoms/cm$^3$. The term "in situ" denotes that the dopant, e.g., n-type or p-type dopant, is introduced to the base semiconductor material, e.g., silicon or silicon germanium, during the formation of the base material. For example, an in situ doped epitaxial material may introduce n-type or p-type dopants to the material being formed during the epitaxial deposition process that includes n-type or p-type source gasses.

In one embodiment, the n-type gas dopant source may include arsine ($AsH_3$), phosphine ($PH_3$) and alkylphosphines, such as with the empirical formula $R_xPH_{3-x}$, where R=methyl, ethyl, propyl or butyl and x=1, 2 or 3. Alkylphosphines include trimethylphosphine $((CH_3)_3P)$, dimethylphosphine $((CH_3)_2PH)$, triethylphosphine $((CH_3CH_2)_3P)$ and diethylphosphine $((CH_3CH_2)_2PH)$. The p-type gas dopant source may include diborane ($B_2H_6$). The source gas for the base material may be provided by germane, digermane, halogermane, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

The epitaxial source and drain region structures 45 may merge epitaxial regions extending between adjacent fin structures. By "merge" it is meant that the epitaxial material may be in direct contact with two adjacent fins structures 10.

In some embodiments, the n-type or p-type dopant is diffused, i.e., driven, from the epitaxial source and drain region structures 45 into a source and drain region portions of the fin structures 10. In one embodiment, the thermal annealing that diffuses the dopant from the epitaxial source and drain region structures 45 into the source and drain region portions of the fin structures 10 includes an annealing process selected from the group consisting of rapid thermal annealing (RTA), flash lamp annealing, furnace annealing, laser annealing and combinations thereof. In one embodiment, the thermal annealing for driving the dopant, i.e., p-type or n-type dopant, from the epitaxial source and drain region structures 45 into the source and drain region portions of the fin structures 10 may include a temperature ranging from 800° C. to 1200° C., and a time period ranging from 10 milliseconds to 100 seconds.

Although FIG. 7 depicts forming a gate sidewall spacer 50 and epitaxial source and drain region structures 45 in a structure including a sacrificial gate cap 40 formed using thermal oxidation, as described in FIG. 5A, the steps of forming the gate sidewall spacer 50 and the epitaxial source and drain region structures 45 are equally applicable to the embodiments of the present disclosure that employ a deposited sacrificial gate cap 40, as described above with reference to FIGS. 5B and 5C.

Figure 8A:
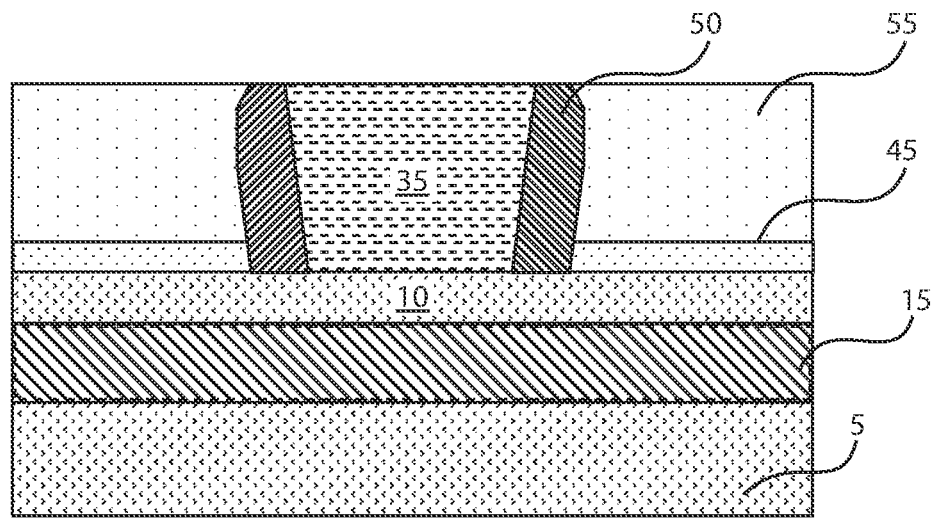
FIG. 8A is a side cross-sectional view parallel to the length of the fin structure depicting one embodiment of removing the sacrificial gate cap using planarization, in accordance with one embodiment of the present disclosure.
Figure 8B:
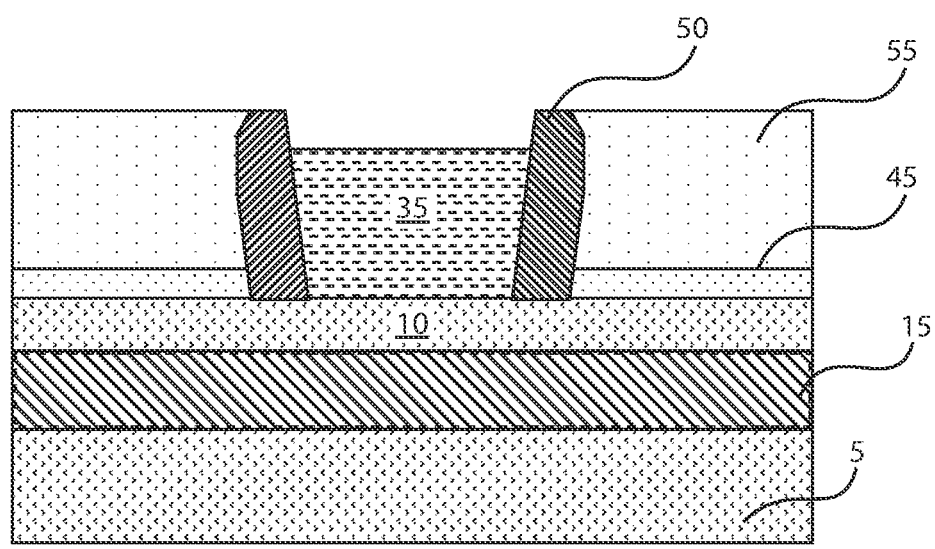
FIG. 8B is a side cross-sectional view parallel to the length of the fin structure depicting one embodiment of removing the sacrificial gate cap using etching, in accordance with one embodiment of the present disclosure.

FIGS. 8A and 8B depict some embodiments of forming an interlevel dielectric material 55 on the epitaxial source and drain region structures 45. The interlevel dielectric material 55 may be selected from the group consisting of silicon-including materials such as $SiO_2$, SiN, $Si_3N_4$, $SiO_xN_y$, SiC, SiCO, SiCOH, and SiCH compounds; the above-mentioned silicon including materials with some or all of the Si replaced by Ge; carbon-doped oxides; inorganic oxides; inorganic polymers; hybrid polymers; organic polymers such as polyamides or SiLKw; other carbon-containing materials; organo-inorganic materials such as spin-on glasses and silsesquioxane-based materials; and diamond-like carbon (DLC, also known as amorphous hydrogenated carbon, α-C:H). The interlevel dielectric material 55 may be deposited using at least one of spinning from solution, spraying from solution, chemical vapor deposition (CVD), plasma enhanced CVD (PECVD), sputter deposition, reactive sputter deposition, ion-beam deposition, and evaporation. Following deposition of the interlevel dielectric material 55, a planarization processes is conducted so that the upper surface of the interlevel dielectric material 55 is coplanar with the upper surface of the sacrificial gate cap 40. The planarization of the interlevel dielectric material 55 may be provided by chemical mechanical planarization.

FIGS. 8A and 8B further depict removing the sacrificial gate cap 40 to expose the underlying sacrificial gate structure 35. Referring to FIG. 8A, in some embodiments, the sacrificial gate cap 40 may be removed using a planarization method, such as chemical mechanical planarization or grinding. In this embodiment, the planarization process is applied to the upper surface of the sacrificial gate cap 40 until the upper surface of the sacrificial gate structure 35 is exposed. In this embodiment, following planarization the upper surface of the sacrificial gate structure 35 is coplanar with the upper surface of the interlevel dielectric material 55. In some embodiments, the planarization process is applied to a sacrificial gate cap 40 composed of silicon oxide that is present on a sacrificial gate structure 35 of a silicon containing material, such as polysilicon. The oxide containing sacrificial gate cap 40 may be formed using thermal oxidation, as described in FIG. 5A, or may be formed by recessing the sacrificial gate structure 35 and depositing the oxide containing material on the recessed surface of the sacrificial gate structure 35, as described with reference to FIGS. 5B and 5C. Referring to FIG. 8B, in some embodiments, the sacrificial gate cap 40 may be removed using a selective etch process. For example, the sacrificial gate cap 40 may be removed by an etch chemistry that removes the material of the sacrificial gate cap 40, e.g., silicon nitride, selectively to the material of the underlying sacrificial gate structure 35, e.g., polysilicon. The etch process may also be selective to the interlevel dielectric material 55. In this embodiment, following the selective etch process the upper surface of the sacrificial gate structure 35 may be vertically offset from the upper surface of the interlevel dielectric material 55. In some embodiments, the selective etch process may be employed to remove the sacrificial gate cap 40 that is in accordance with the sacrificial gate recess and deposition steps that are described above with reference to FIGS. 5B and 5C.

Figure 9:
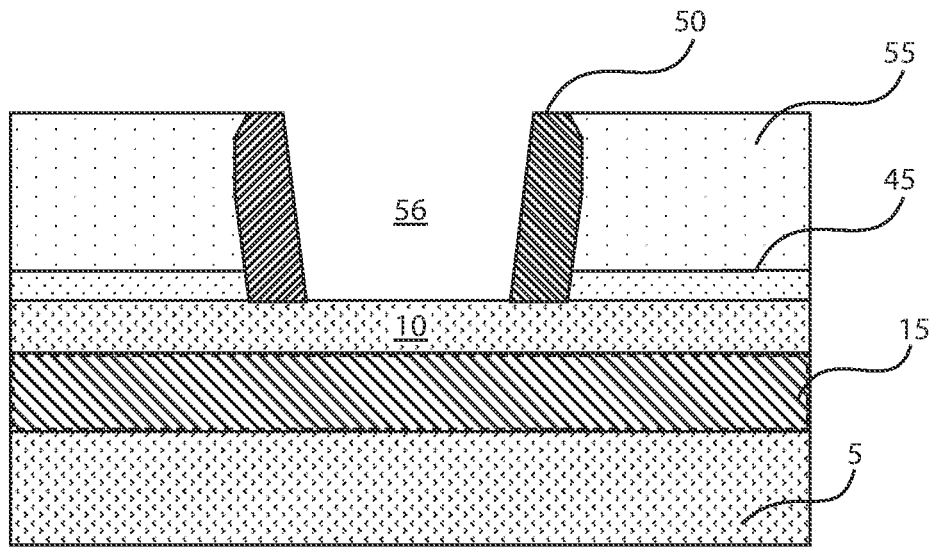
FIG. 9 is a side cross-sectional view parallel to the length of the fin structure depicting one embodiment of removing the replacement gate structure to provide an opening to the channel region portion of the fin structure, in accordance with one embodiment of the present disclosure.

FIG. 9 depicts one embodiment of removing the sacrificial gate structure 35 to form an opening 56 to the channel portion of the fin structure 10. In some embodiments, the sacrificial gate structure 35 may be removed by an etch process that is selective to the interlevel dielectric material 55, the gate sidewall spacers 50 and the fin structure 10. The etch process may include at least one of reactive ion etch, plasma etching and wet chemical etching. The step of removing the sacrificial gate structure 35 is equally applicable to the embodiments of the present disclosure that employ a sacrificial gate cap 40 formed using thermal oxidation, as described above with reference to FIG. 5A, or a deposited sacrificial gate cap 40, as described above with reference to FIGS. 5B and 5C.

Figure 10:
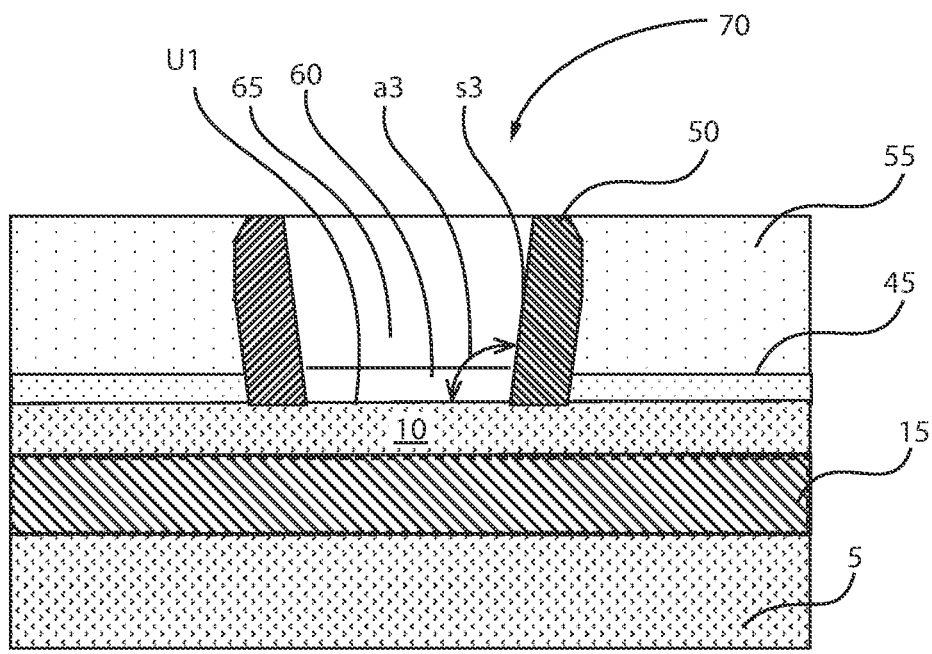
FIG. 10 is a side cross-sectional view parallel to the length of the fin structure depicting forming a functional gate structure in the opening to the channel region portion of the fin structure, in accordance with one embodiment of the present disclosure.

FIG. 10 depicts one embodiment of forming functional gate structures 70 on the channel region portions of the fin structures 10 between the gate sidewall spacers 50. The functional gate structures 70 are formed filling the opening 56 to the channel region portion of the fin structure 10. The geometry of the opening 56 dictates the geometry of the functional sacrificial gate structure 70 that is formed within the opening 56. Because the geometry of the opening 56 is defined by the sacrificial gate structure 35, the functional gate structure 70 will have a geometry that is at least substantially equal to the geometry of the sacrificial gate structure 35. Therefore, the obtuse angle α2 that is defined by the intersection of the sidewall S2 of the sacrificial gate structure and the upper surface U1 of the channel portion of the fin structure 10 that is depicted in FIG. 4 is maintained as an obtuse angle α3 at the intersection of the sidewall S3 of the functional gate structure 70 and the upper surface U1 of the channel portion of the fin structure 10 depicted in FIG. 10. For example, the obtuse angle α3 defined by the intersection of the sidewall S3 of the functional gate structure 70 and the upper surface U1 of the channel portion of the fin structure 10 may range from 91° to 125°. In another example, the obtuse angle α3 defined by the intersection of the sidewall S3 of the functional gate structure 70 and the upper surface U1 of the channel portion of the fin structure 10 ranges from 91° to 105°. In yet another embodiment, the obtuse angle α3 ranges from 91° to 95° C.

In one embodiment, each functional gate structure 70 may be composed of at least one gate dielectric layer 60 and at least one gate conductor layer 65. The at least one gate dielectric layer 60 may be composed of an insulator, and is present between the channel region portion of the fin structure 10 and the at least one gate conductor layer 65 of the functional gate structure 70.

The at least one gate dielectric layer 60 is typically positioned on at least a channel region portion of the fin structures 10. In some embodiments, the at least one gate dielectric layer 60 is deposited only at the base of the opening 56, as depicted in FIG. 9. In other embodiments, the at least one gate dielectric layer 60 is also formed on the interior sidewalls of the gate sidewall spacer 50, to provide a U-shaped cross sectional geometry. The at least one gate dielectric layer 60 may be formed by a thermal growth process such as, e.g., oxidation, nitridation or oxynitridation. In other embodiments, the at least one gate dielectric layer 60 may be formed using a deposition process, such as CVD. In some embodiments, the at least one gate dielectric layer 61 is composed of a low-k dielectric material, such as silicon oxide ($SiO_2$), which typically has a dielectric constant of less than 4.0 at room temperature, e.g. 25° C. In some embodiments, the at least one gate dielectric 60 is composed of a high-k dielectric material. High-k dielectric materials have a dielectric constant greater than silicon oxide ($SiO_2$) at room temperature, e.g., 25° C. For example, a high-k dielectric composed of hafnium oxide ($HFO_2$), may have a dielectric constant of 4.0 or greater.

In one embodiment, the at least one gate dielectric layer 60 may include, but is not limited to, an oxide, nitride, oxynitride and/or silicates including metal silicates, aluminates, titanates and nitrides. In one example, when the at least one gate dielectric layer 60 is comprised of an oxide, the oxide may be selected from the group including, but not limited to, $SiO_2$, $HfO_2$, $ZrO_2$, $Al_2O_3$, $TiO_2$, $La_2O_3$, $SiTiO_3$, $LaAlO_3$, $Y_2O_3$ and mixture thereof. The physical thickness of the at least one gate dielectric layer 60 may vary, but typically, the at least one gate dielectric layer 61 has a thickness ranging from 1 nm to 10 nm.

The at least one gate conductor layer 65 may be composed of polysilicon, SiGe, a silicide, a metal or a metal-silicon-nitride, such as Ta—Si—N. Examples of metals that can be used as the at least one gate conductor layer 65 include, but are not limited to, Al, W, Cu, Ti or other like conductive metals. In some embodiments, the at least one gate conductor layer 65 may be composed of a p-type work function metal layer and/or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device, e.g., a finFET having p-type conductivity source and drain regions, towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device, e.g., a finFET having n-type conductivity source and drain regions. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD). The at least one second gate structure 44 may be formed using deposition, photolithography and etch processes.

The material for the at least one gate conductor 65 may be deposited to fill the space over the channel region portion of the fin structure 10 within the interior sidewalls of the gate sidewall spacer 50. In some embodiments, a planarization process may be applied to the material deposited for the at least one gate conductor layer 65 so that an upper surface of the at least one gate conductor layer 65 is substantially coplanar with an upper surface of the interlevel dielectric material 55. The physical thickness of the at least one gate conductor layer 65 may range from 1 nm to 10 nm.

The step of forming the functional gate structure 70 is equally applicable to the embodiments of the present disclosure that employ a process flow including a sacrificial gate cap 40 formed using thermal oxidation, as described above with reference to FIG. 5A, or a process flow that includes a deposited sacrificial gate cap 40, as described above with reference to FIGS. 5B and 5C.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a gate structure present on a channel portion of a fin structure, wherein the gate structure has a sidewall that intersects with the upper surface of the channel portion of the fin structure, wherein an obtuse angle is defined between the sidewall of the gate structure and the upper surface of the channel portion of the fin structure;
   a spacer composed of a single material layer in direct contact with an entire sidewall of a gate conductor of the gate structure, the gate structure and the spacer having a common base surface in direct contact with the fin structure, and the gate conductor directly contacting the spacer at the defined obtuse angle;
   an epitaxial source region structure on a source region portion of the fin structure; and
   an epitaxial drain region structure on a drain region portion of the fin structure, wherein the epitaxial source region structure and the epitaxial drain region structure are direct contact with a sidewall of the spacer that is opposite the sidewall of the spacer contacting the gate structure.

2. The semiconductor device of claim 1, wherein the obtuse angle ranges from 91° to 95°.

3. The semiconductor device of claim 1, wherein the epitaxial source region structure and the epitaxial drain region structure are doped to a p-type conductivity.

4. The semiconductor device of claim 3, wherein the gate conductor of the gate structure is comprised of a metal having a work function that ranges from 4.9 eV to 5.2 eV.

5. The semiconductor device of claim 1, wherein the epitaxial source region structure and the epitaxial drain region structure are doped to an n-type conductivity.

6. The semiconductor device of claim 5, wherein the gate conductor of the gate structure is comprised of a metal having a work function that ranges from 4.1 eV to 4.3 eV.

7. The semiconductor device of claim 1, wherein the spacer has an inner sidewall having an obtuse angle defined between the inner sidewall of the spacer and the upper surface of the channel portion of the fin structure relative to the gate structure.

8. The semiconductor device of claim 7, wherein the obtuse angle of the inner sidewall of the spacer ranges from 91° to 95°.

9. A semiconductor device comprising:
   a fin structure;
   a gate structure present on a channel portion of the fin structure, the gate structure having a sidewall that intersects with the upper surface of the channel portion of the fin structure at an obtuse angle, wherein the obtuse angle ranges from 91° to 95°;
   a spacer of a single material layer in direct contact with an entire sidewall of a gate conductor of the gate structure, the gate structure and the spacer having a common base surface in direct contact with the fin structure, and the gate conductor directly contacting the spacer at the defined obtuse angle;
   a source region structure on a source region portion of the fin structure; and
   an drain region structure on a drain region portion of the fin structure, wherein the source and the drain region structures are direct contact with a sidewall of the spacer that is opposite the sidewall of the spacer contacting the gate structure.

10. The semiconductor device of claim 9, wherein the source region structure and the drain region structure are each comprised of an epitaxial semiconductor material and doped to an p-type conductivity.

11. The semiconductor device of claim 10, wherein the gate conductor of the gate structure is comprised of a metal having a work function that ranges from 4.9 eV to 5.2 eV.

12. The semiconductor device of claim 9, wherein the source region structure and the drain region structure are composed of an epitaxial semiconductor material that is doped to an n-type conductivity.

13. The semiconductor device of claim 12, wherein the gate conductor of the gate structure is comprised of a metal having a work function that ranges from 4.1 eV to 4.3 eV.

14. The semiconductor device of claim 9, wherein the spacer has an inner sidewall having an obtuse angle defined between the inner sidewall of the gate sidewall spacer and the upper surface of the channel portion of the fin structure relative to the gate structure.

15. The semiconductor device of claim 14, wherein the spacer has an outer sidewall having an obtuse angle defined between the outer sidewall of the gate sidewall and the upper surface of the channel portion of the fin structure relative to the gate structure.

16. The semiconductor device of claim 15, wherein the obtuse angle of at least one of the inner sidewall and the outer sidewall of the gate sidewall spacer ranges from 91° to 95°.

* * * * *